United States Patent
Soma

(10) Patent No.: US 8,004,837 B2
(45) Date of Patent: Aug. 23, 2011

(54) CONTROL DEVICE

(75) Inventor: Akira Soma, Fukuoka (JP)

(73) Assignee: Kabushiki Kaisha Yaskawa Denki, Kitakyushu-shi, Fukuoka (JP)

(*) Notice: Subject to any disclaimer, the term of this patent is extended or adjusted under 35 U.S.C. 154(b) by 128 days.

(21) Appl. No.: 12/444,503

(22) PCT Filed: Sep. 28, 2007

(86) PCT No.: PCT/JP2007/068919
§ 371 (c)(1),
(2), (4) Date: Apr. 6, 2009

(87) PCT Pub. No.: WO2008/044487
PCT Pub. Date: Apr. 17, 2008

(65) Prior Publication Data
US 2010/0103617 A1   Apr. 29, 2010

(30) Foreign Application Priority Data

Oct. 13, 2006   (JP) .................. 2006-280265

(51) Int. Cl.
*H05K 7/20* (2006.01)
(52) U.S. Cl. .................. 361/695; 361/715; 361/720
(58) Field of Classification Search .................. None
See application file for complete search history.

(56) References Cited

U.S. PATENT DOCUMENTS

| | | | | | |
|---|---|---|---|---|---|
| 4,461,524 | A | * | 7/1984 | McGhee | 439/325 |
| 5,057,971 | A | * | 10/1991 | Hautvast et al. | 361/740 |
| 5,204,805 | A | * | 4/1993 | Takahashi et al. | 361/720 |
| 5,559,674 | A | * | 9/1996 | Katsui | 361/697 |
| 2003/0206392 | A1 | * | 11/2003 | Kawata | 361/631 |
| 2004/0252461 | A1 | * | 12/2004 | Wu | 361/704 |
| 2005/0030718 | A1 | * | 2/2005 | Villanueva et al. | 361/710 |

FOREIGN PATENT DOCUMENTS

| JP | 63-000198 A | 1/1988 |
|---|---|---|
| JP | 5-3393 A | 1/1993 |
| JP | 2001-244648 A | 9/2001 |

OTHER PUBLICATIONS

International Search Report of PCT/JP2007/068919, date of mailing Jan. 8, 2008.
Anticipation Rejection dated Aug. 31, 2010, issued in corresponding Japanese Patent Application No. 2008-538639.

* cited by examiner

*Primary Examiner* — Gregory D Thompson
(74) *Attorney, Agent, or Firm* — Westerman, Hattori, Daniels & Adrian, LLP

(57) ABSTRACT

It is possible to provide a small-size and light-weight control device having a structure which prevents detaching of a board even when an external shock is applied without using a screwed connection. The control device is formed by a case (1) including at least one board (2, 3), a radiator (5), and a protection cover (4). The case (1) includes at least one latch portion (7, 8) in an upper part or a lower part of a board support frame (16).

10 Claims, 8 Drawing Sheets

CONTROL DEVICE

TECHNICAL FIELD

The present invention relates to a control device for operating an industrial appliance.

BACKGROUND ART

Two types of control devices have been proposed. In a first example, components are fixed with screws (see, for example, Patent Document 1). In a second example, components are mounted from one direction without using screws (see, for example, Patent Document 2).

Referring to FIG. 11, the first existing example is described. As shown in FIG. 11, a control device is constructed by placing a printed circuit board 102 on a base 103, screwing a screw 119 into a through hole 113 in the printed circuit board 102 and a screw hole 106 in a board mounting boss 107 so as to fasten the printed circuit board 102 to the base 103, joining a fitting protrusion in an inner cover mounting boss 109 of the base 103 to a fitting recess in a boss 116 on an inner cover 104, pinching the printed circuit board 102 with the inner cover 104, fastening the inner cover 104 with screws 120, and covering the entire base 103 with a cover 105.

Referring to FIGS. 12 and 13, the second existing example is described. As shown in FIG. 12, an existing control device is assembled as follows. First, an LCD case 210 is fixed to a back surface or another part of a printed circuit board 202 with connecting pieces 211c by soldering or the like. Next, as indicated by arrow A in FIG. 13, a side plate 213 of an LCD cover 212 is hooked to bent portions 211b of a side plate 211 of the LCD case 210, an LCD cover 212 is rotated around the hooked portion as indicated by arrow B in the figure, and notches 213a in another side plate 213 of the LCD cover 212 are engaged with other bent portions 211a. By moving the LCD cover 212 in this state, the bent portions 211a and the notches 213a are engaged with each other, and the LCD case 210 is engaged with the LCD cover 212, whereby assembly is completed.

Patent Document 1: Japanese Unexamined Patent Application Publication No. 2001-244648 (p. 3, FIG. 1)

Patent Document 2: Japanese Unexamined Patent Application Publication No. 63-000198 (p. 2, FIGS. 1 and 2)

DISCLOSURE OF INVENTION

Problems to be Solved by the Invention

Control devices are broadly used in the fields of robots, machine tools, automobiles, and the like. High reliability and ease of maintenance are required for a control device, while reduction in size and weight is also desired. Thus, by changing the mounting structure of a control device from a two-dimensional structure to a three-dimensional structure, the space for disposing the control device is efficiently used. However, in the mounting structure of a board, electronic components are densely mounted on the board, the areas to which stacked boards are attached are limited, and it has been desired that a control device be configured such that the boards are not separated even when an external shock is applied.

However, because an existing control device is configured such that stacked boards are fastened with screws, it is necessary to secure a space and an insulation distance for fastening the screws, thereby causing a problem in that reduction in size is hindered. Moreover, there is a problem with fastening using screws in that the screws may be loosened by repeated vibrations or shocks and the boards may fall off. Furthermore, there is a problem in that workability is reduced because it is necessary to remove the screws in order to carry out maintenance of the boards.

In addition, in the case of a top mounting method in an existing control device, there is a problem in that the number of parts increases because parts are used among the components. When the number of parts increases, reduction in size and weight becomes unfeasible, which causes a problem in that the control device has to be disposed in a larger space.

The present invention, which has been achieved to overcome the problems, aims to provide a control device having a structure with which the number of parts is reduced, reduction in the size and weight of the control device is realized, and boards are prevented from falling off when an external shock is applied without using a screw connection.

Means for Solving the Problems

In order to solve the above-described problems, the present invention is configured as follows.

In the invention according to a first aspect, a control device comprises a case, the case including at least one board and a radiator, wherein the case includes at least one latch portion in an upper part or a lower part of a board support frame.

In the invention according to a second aspect, the case includes pillars disposed in four corners and the board support frame connecting the pillars.

In the invention according to a third aspect, the case includes board support frames, a pair of opposing board support frames including latch portions for fixing a first board, and another pair of opposing board support frames including latch portions for supporting a second board.

In the invention according to a fourth aspect, the first board is engaged with the latch portions included in the upper parts of the board support frames and the second board is engaged with the latch portions included in the lower parts of the board support frames.

In the invention according to a fifth aspect, the case includes board support frames, a pair of opposing board support frames including latch portions for fixing a first board in upper parts thereof and elastic holes for supporting a second board in lower parts thereof.

In the invention according to a sixth aspect, at least one guide notch portion for positioning the board with respect to the case is formed in an outer peripheral surface of the board.

In the invention according to a seventh aspect, a latch portion for positioning the radiator with respect to the case is formed in an outer peripheral surface of the radiator.

In the invention according to an eighth aspect, the radiator includes a board including a cooling fan.

In the invention according to a ninth aspect, the control device further comprises a protective cover, wherein at least one recess is formed in an outer peripheral surface of the protective cover and engaged with the latch portion of the case.

In the invention according to a tenth aspect, a control device comprises a case including at least one board and a radiator, wherein the case includes at least two latch portions with different heights in an upper part or a lower part of a board support frame.

In the invention according to an eleventh aspect, at least one pillar is included on a side of the latch portion.

In the invention according to a twelfth aspect, the case includes board support frames, a pair of opposing board support frames including latch portions for fixing at least one of the boards, and another pair of opposing board support frames including latch portions for fixing the board stacked on the at least one of the boards.

In the inventions according to a thirteenth aspect and a fourteenth aspect, the board disposed on the top includes a rib being in contact with a pillar included in the case.

In the inventions according to a fifteenth aspect and a sixteenth aspect, the latch portion engaged with an elastic hole included in the case also serves as a pillar for supporting the board.

Advantages

With the inventions according to the first to sixteenth aspects, because the boards are fixed without using fastening members such as screws, the number of parts can be reduced and the boards are prevented from falling off even when an external shock is applied. Moreover, because the boards are configured to be supported with the latch portions and the elastic holes, assembling and disassembling can be carried out easily, whereby workability in maintenance is improved. Moreover, because the boards can be assembled and removed from above or below the case, workability is improved without increasing the number of parts. Furthermore, because the plurality of boards can be supported by providing the plurality of latch portions of different heights, expandability is high and space can be efficiently used.

In particular, with the inventions according to the eleventh aspect and the thirteenth to sixteenth aspects, the boards are prevented from falling off with external shocks or vibrations, because the pillars and the ribs for fixing the boards are formed so as to hold the boards more securely.

Figure 1:
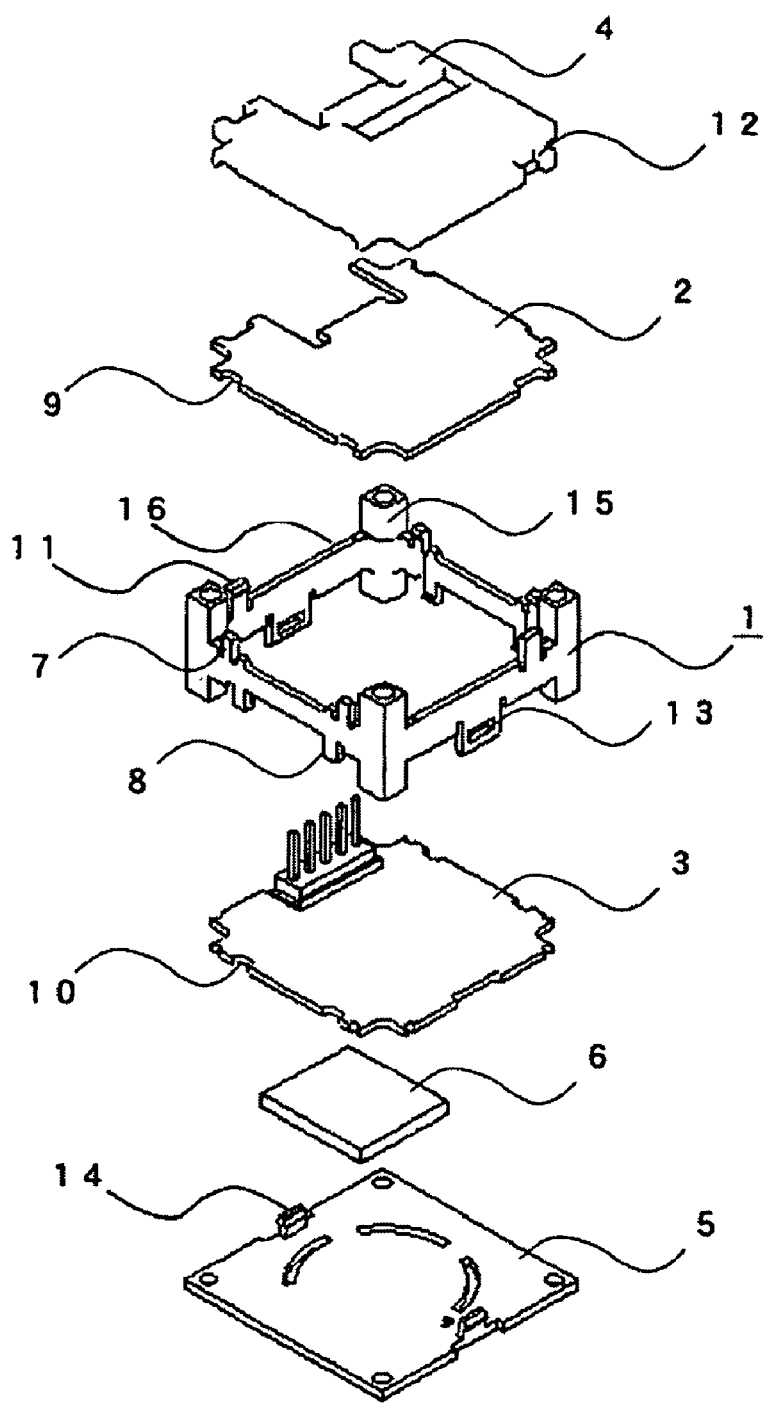
FIG. 1 is an exploded perspective view of a control device according to a first embodiment of the present invention.

REFERENCE NUMERALS 1 case
2 first printed circuit board
3 second printed circuit board
4 protective cover
5 radiator
6 heat conductive sheet
7 first latch portion
8 second latch portion
9 guide notch portion
10 guide notch portion
11 third latch portion
12 recess
13 elastic hole
14 latch portion
15 pillar/board positioning portion
16 board support frame
17 cooling fan plate
20 latch portion
21 case
22 first latch portion
23 second latch portion
24 third latch portion
25 fourth latch portion
26 first printed circuit board
27 second printed circuit board
28 third printed circuit board
29 fourth printed circuit board
30 guide notch portion
31 guide notch portion
32 guide notch portion
33 guide notch portion
34 first pillar
35 second pillar
36 board support frame
41 rib
102 printed circuit board
103 base
104 inner cover
105 cover
106 screw hole
107 board mounting boss
109 inner cover mounting boss
113 through hole
116 boss
119 screw
120 screw
202 printed circuit board
210 LCD case
211 side plate
211*a* bent portion
211*b* bent portion
211*c* connecting piece
212 LCD cover
213 side plate
213*a* notch

BEST MODES FOR CARRYING OUT THE INVENTION

Hereinafter, embodiments of the present invention are described with reference to the drawings.

First Embodiment

FIG. 1 is an exploded view showing a structure of a control device for carrying out a method of the present invention. The figure shows a case 1, a first printed circuit board 2, a second printed circuit board 3, a protective cover 4, and a radiator 5.

The present invention is different from Patent Document 1 and Patent Document 2 in that the case includes latch portions for fixing the boards to be stacked, the latch portions being disposed in an upper part or a lower part of board support frames of the case.

The case 1 includes pillar/board positioning portions 15 in the four corners thereof, each of the pillar/board positioning portions 15 being connected with board support frames 16 by adhesion or the like. Alternatively, the pillar/board positioning portions 15 and the board support frames 16 are integrally formed. Elastic holes 13 are formed in lower parts of a pair of board support frames 16, and third latch portions 11 are formed in upper parts of the pair of board support frames 16. First latch portions 7 and second latch portions 8 are formed in upper parts and lower parts of another pair of board support frames 16.

Next, the first printed circuit board 2 is described. Guide notch portions 9 are formed in an outer peripheral surface of the first printed circuit board 2 so that the first printed circuit board 2 is positioned with respect to the case 1.

The second printed circuit board 3 is described. Guide notch portions 10 are formed in an outer peripheral surface of the second printed circuit board 3 so that the second printed circuit board 3 is positioned with respect to the case 1.

The radiator 5 is described. Latch portions 14 are formed on a pair of sides of an outer peripheral surface of the radiator 5 so as to be engaged with the elastic holes 13 of the case 1.

Figure 2:
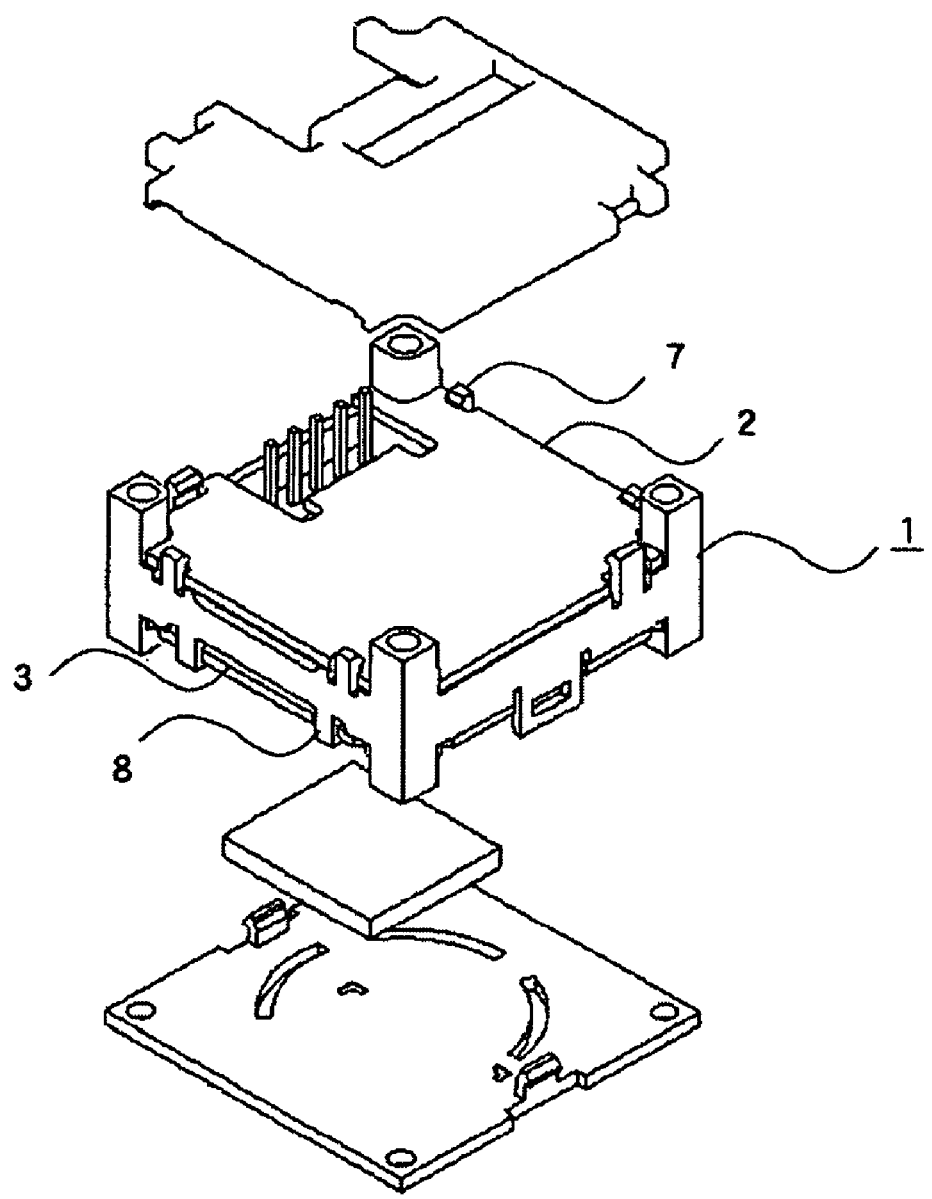
FIG. 2 is an exploded perspective view of the control device according to the first embodiment of the present invention.
Figure 3:
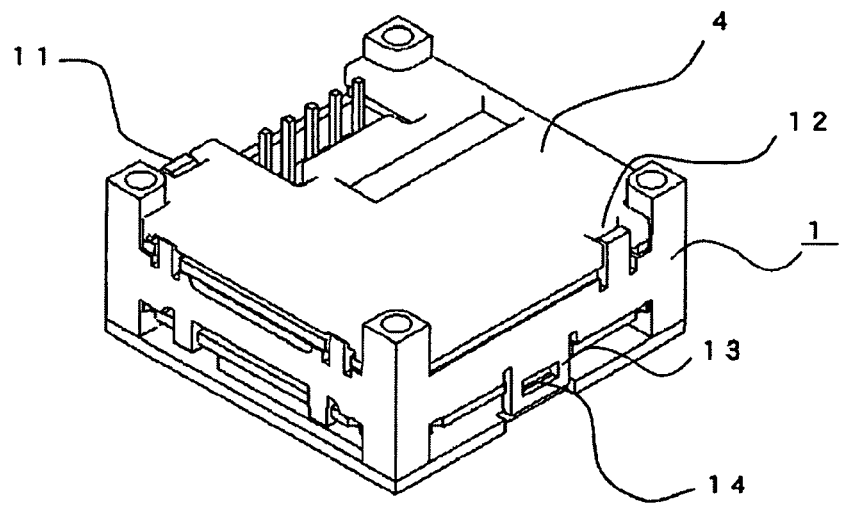
FIG. 3 is an assembled perspective view of the control device according to the first embodiment of the present invention.

Next, referring to FIGS. 1, 2, and 3, an assembly process of the control device is described. First, the second printed circuit board 3 is inserted into the case 1 such that the guide notch portions 10 formed in four positions in the outer peripheral surface are positioned along the second latch portions 8 formed in the case 1, and the second printed circuit board 3 is fixed with the second latch portions 8 of the case 1.

Next, the first printed circuit board 2 is inserted into the case 1 such that the guide notch portions 9 formed in four positions in the outer peripheral surface are positioned along the first latch portions 7 formed in the case 1, and the first printed circuit board 2 is fixed with the first latch portions 7 of the case 1.

Next, the radiator 5 is fixed by engaging the latch portions 14 formed on the outer peripheral surface with the elastic holes 13 of the case 1.

Next, regarding the protective cover 4, recesses 12 formed in its outer peripheral surface are fixed with the third latch portions of the case 1.

Second Embodiment

Figure 4:
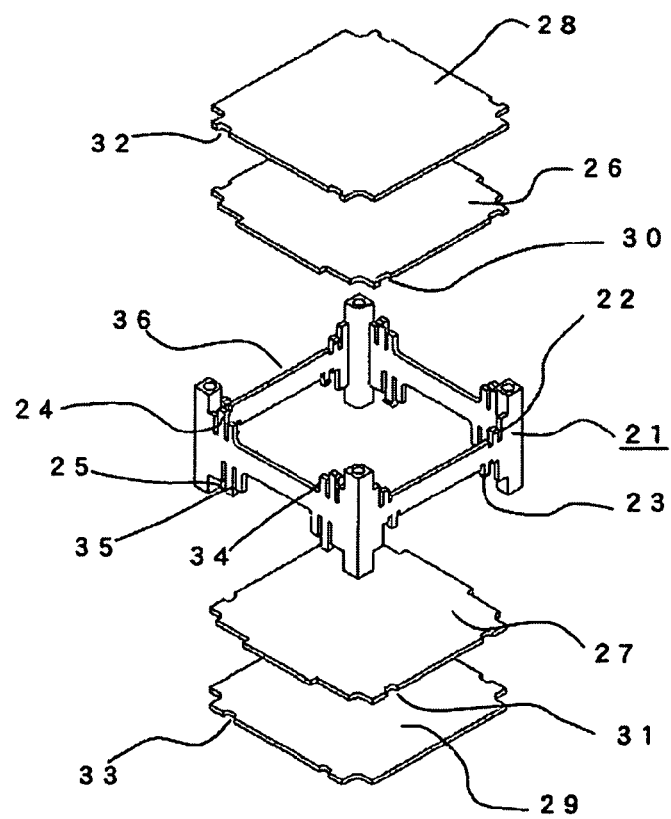
FIG. 4 is an exploded perspective view of a control device according to a second embodiment of the present invention.
Figure 5:
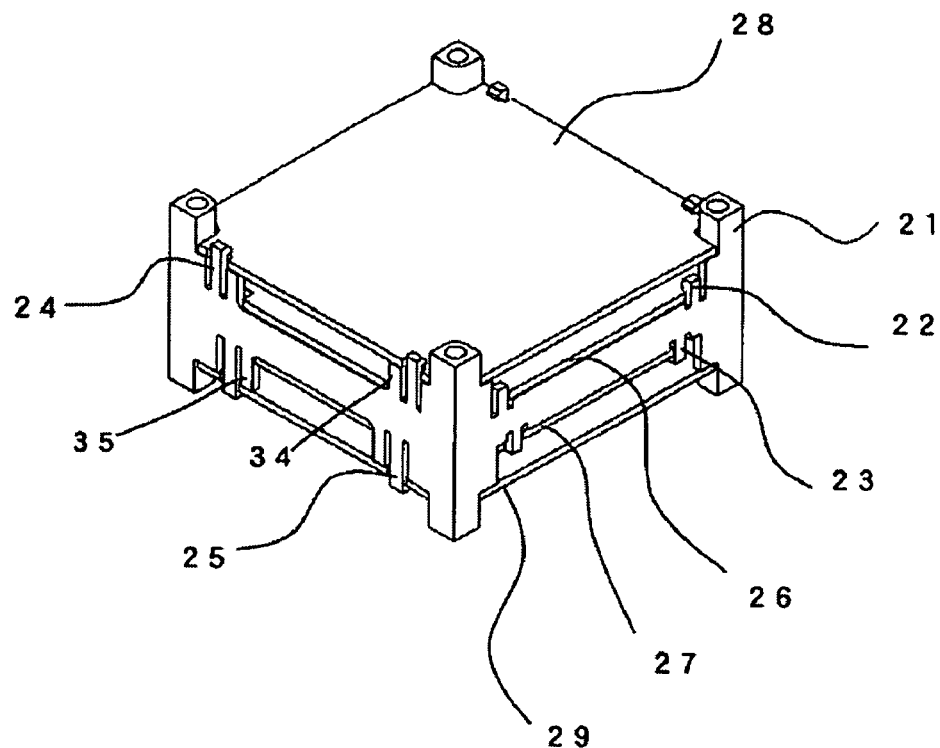
FIG. 5 is an assembled perspective view of the control device according to the second embodiment of the present invention.

Next, referring to FIGS. 4 and 5, a second embodiment of the present invention is described. The present invention is different from the first embodiment in that a plurality of latch portions are formed in an upper part and a lower part of the board support frames of the case so that three or more printed circuit boards can be fixed.

Differences from the first embodiment are described. In a case 21, first latch portions 22 and second latch portions 23 are formed in upper parts and lower parts of a pair of board support frames 36. Third latch portions 24 and fourth latch portions 25 are formed in upper parts and lower parts of another pair of board support frames 36. Moreover, first pillars 34 and second pillars 35 are formed adjacent to the third latch portions 24 and the fourth latch portions 25.

Next, referring to FIGS. 4 and 5, an assembly process is described. First, a second printed circuit board 27 is inserted into the case 21 such that guide notch portions 31 formed in four positions in the outer peripheral surface are positioned along the second latch portions 23 formed in the case 21, and the second printed circuit board 27 is fixed with the second latch portions 23 of the case 21.

Next, a first printed circuit board 26 is inserted into the case 21 such that guide notch portions 30 formed in four positions in the outer peripheral surface are positioned along the first latch portions 22 formed in the case 21, and the first printed circuit board 26 is fixed with the first latch portions 22 of the case 21.

Next, a fourth printed circuit board 29 is inserted into the case 21 such that guide notch portions 33 formed in four positions in the outer peripheral surface are positioned along the fourth latch portions 25 formed in the case 21, and the fourth printed circuit board 29 is fixed with the fourth latch portions 25 of the case 21. At this time, the fourth printed circuit board 29 is fixed while being supported by the second pillar 35.

Next, a third printed circuit board 28 is inserted into the case 21 such that guide notch portions 32 formed in four positions in the outer peripheral surface are positioned along the third latch portions 24 formed in the case 21, and the third printed circuit board 28 is fixed with the third latch portions 24 of the case 21. At this time, the third printed circuit board 28 is fixed while being supported by the first pillars 34.

In the embodiment described here, latch portions of different heights are disposed in pairs on board support frames. However, latch portions of different heights may be disposed on the same board support frame. Needless to say, that latch portions of different heights may be disposed, for example, on a pair of opposing board support frames. The embodiment is described using an example having four printed circuit boards. However, needless to say, four or more printed circuit boards can be stacked by forming latch portions of different heights. Not only printed circuit boards, but also a combination of radiators and protective covers can be stacked.

Third Embodiment

Figure 6:
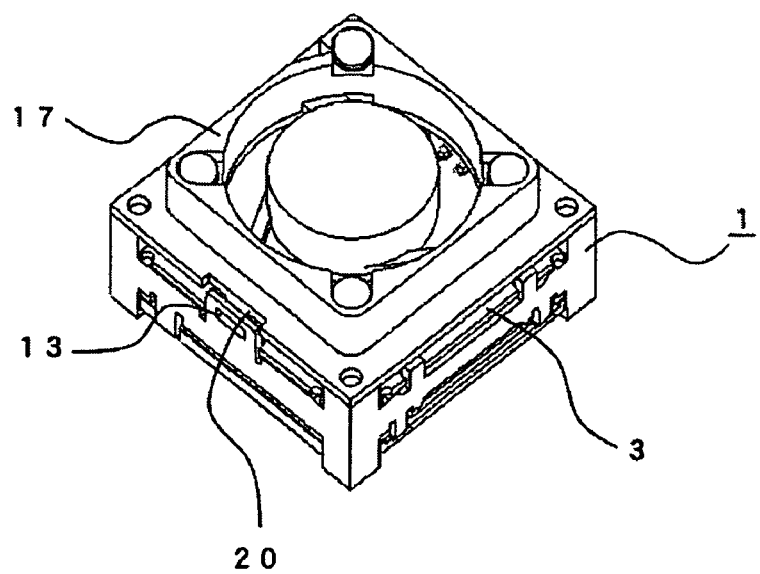
FIG. 6 is an assembled perspective view of a control device according to a third embodiment of the present invention.

Next, referring to FIG. 6, a third embodiment of the present invention is described. The third embodiment is different from the first embodiment and the second embodiment of the present invention in that elastic holes are formed in a pair of upper parts of an outer peripheral surface of a case so as to fix a cooling fan plate.

As shown in FIG. 6, a cooling fan plate 17 has latch portions 20 formed in a pair of sides of an outer peripheral surface thereof, and the cooling fan plate 17 is disposed such that the latch portions 20 are fixed to elastic holes 13 formed in a pair of upper parts of an outer peripheral surface of a case 1.

Fourth Embodiment

Figure 7:
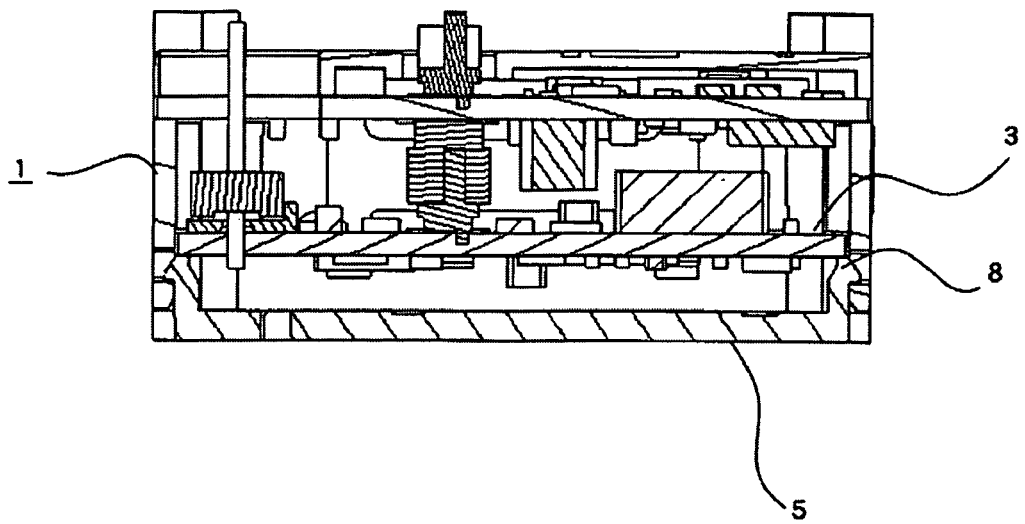
FIG. 7 is a sectional view of a control device according to a fourth embodiment of the present invention.
Figure 8:
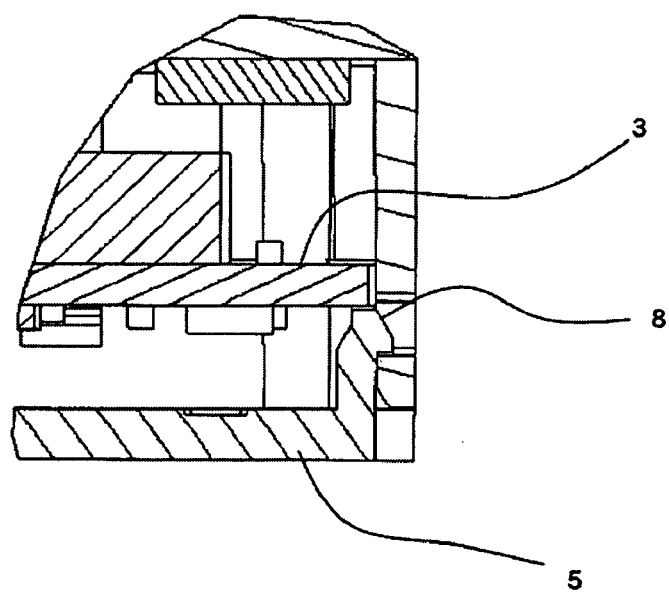
FIG. 8 is an enlarged view of the control device according to the fourth embodiment of the present invention.

Next, referring to FIGS. 7 and 8, a fourth embodiment of the present invention is described. The fourth embodiment is different from the first to third embodiments of the present invention in that latch portions of a radiator fixed to elastic holes formed in a pair of lower parts of an outer peripheral surface of a case also serve as pillars for supporting a board positioned above.

FIG. 7 shows a sectional view of a control device, and FIG. 8 shows an enlarged view of a latch portion. Latch portions 8 formed in a radiator 5 are fit into elastic holes 13 of a case 1, and the radiator 5 is fixed to the case 1. At this time, the latch portions 8 are disposed so that the latch portions 8 support the bottom surface of the second printed circuit board 3 and fix the second printed circuit board 3.

Although the latch portions are formed in the radiator and fitted into the elastic holes in the case so that the printed circuit board is supported from the bottom, it is not necessary that the latch portions be formed in the radiator. The latch portions may be formed in a component attached to the case, such as a printed circuit board or a protective cover. Moreover, although the radiator including the latch portions is disposed at the lowermost position in the configuration described here, it is not necessary that the latch portions be disposed at the lowermost position. It is evident that a board including the latch portions may be a board in the middle of the stack.

Fifth Embodiment

Figure 9:
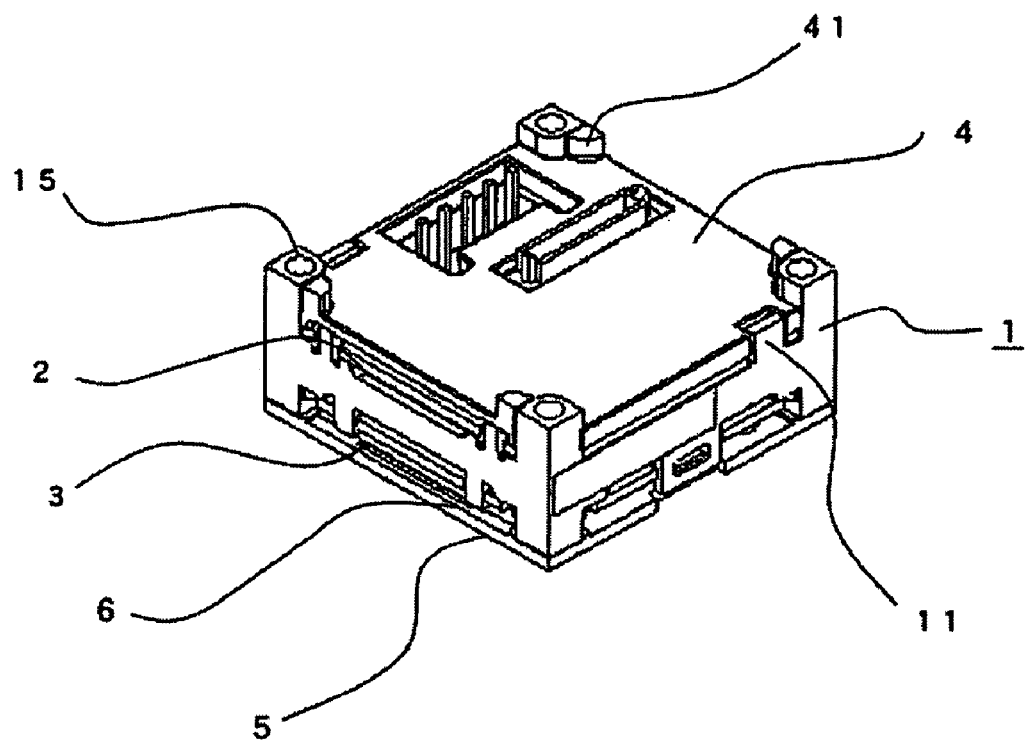
FIG. 9 is an assembled perspective view of a control device according to a fifth embodiment of the present invention.
Figure 10:
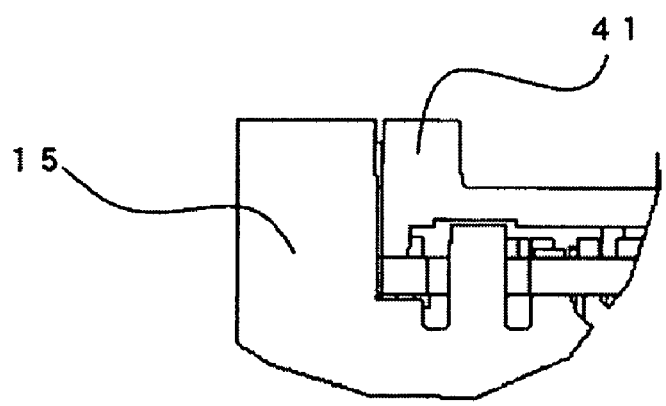
FIG. 10 is an enlarged view of a rib of the control device according to the fifth embodiment of the present invention.
Figure 11:
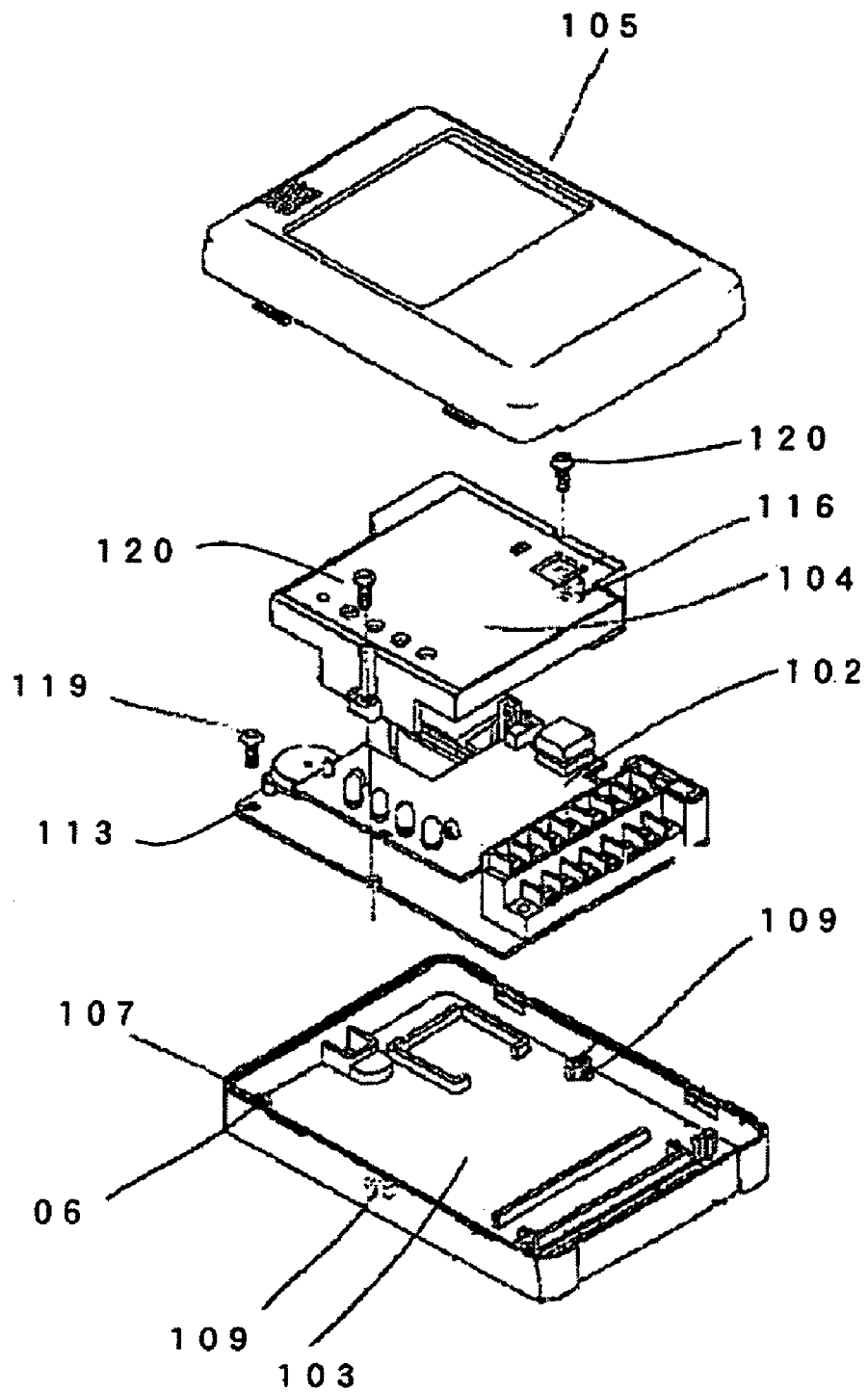
FIG. 11 is an exploded perspective view of a first existing control device.
Figure 12:
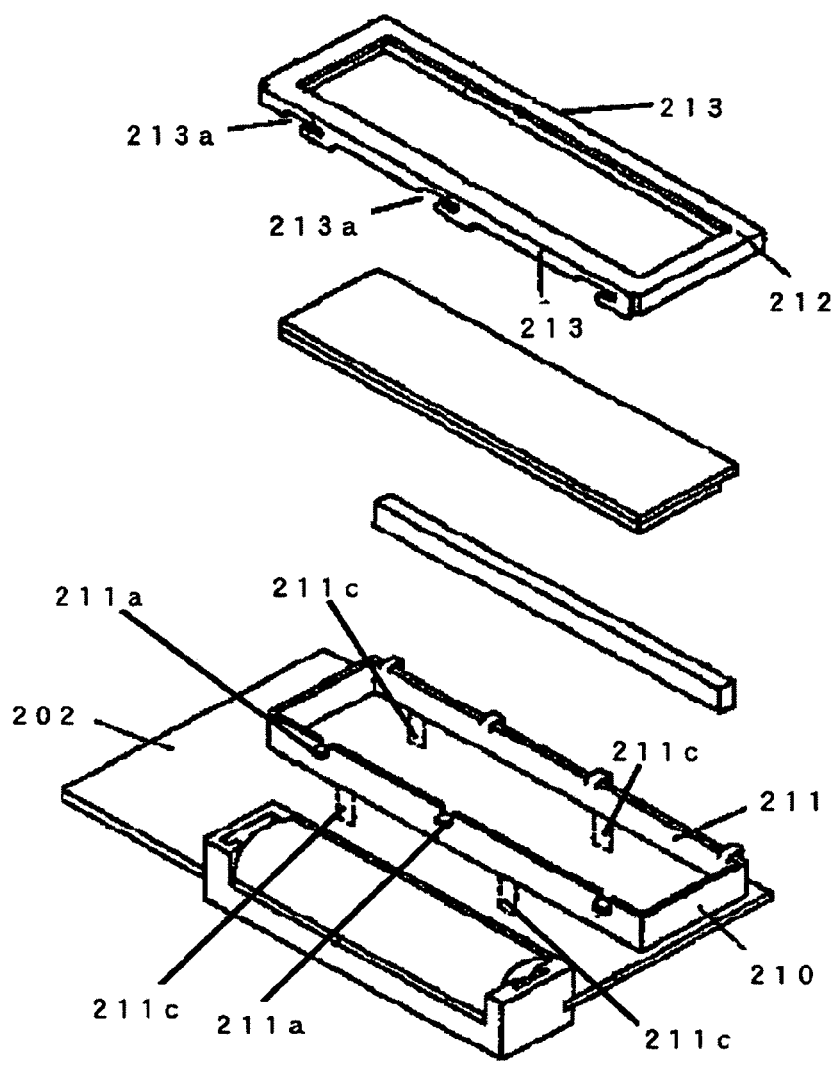
FIG. 12 is an exploded perspective view of a second existing control device.
Figure 13:
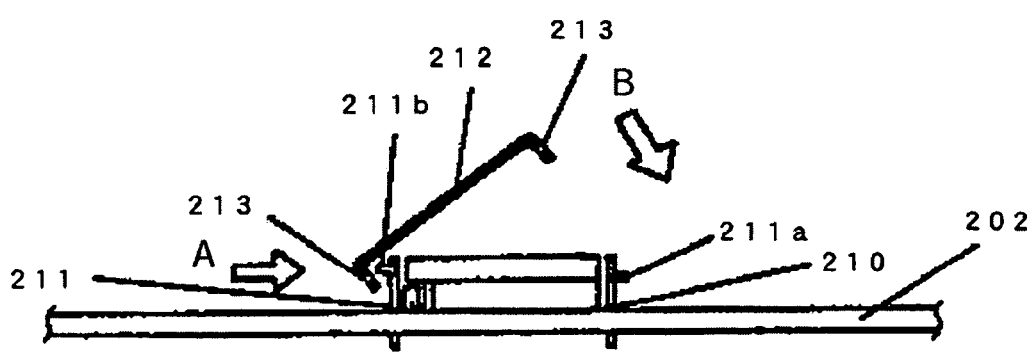
FIG. 13 is a side view of a second existing control device.

Next, referring to FIGS. 9 and 10, a fifth embodiment of the present invention is described. The fifth embodiment is different from the first to fourth embodiments of the present invention in that ribs are formed on a cover in contact with the pillar/board positioning portions in the four corners of the case.

FIG. 9 shows a perspective view of the control device, and FIG. 10 shows an enlarged view of a rib portion. Ribs 41 are formed on a protective cover 4, and a surface of the each rib 41 is disposed in contact with a corresponding pillar/board positioning portion 15 in a case 1. By doing so, falling off is prevented due to a supporting effect of the ribs 41.

Industrial Applicability

The present invention is also applicable to a multi-axis control device, because the number of stacks can be increased by increasing the number of latch portions and pillars on the board support frames.

The invention claimed is:

1. A control device comprising a case, the case including at least a first board and a second board, and a radiator,
   wherein the case includes a pair of opposing board support frames including latch portions for fixing the first board, and another pair of opposing board support frames including latch portions for supporting the second board,
   wherein the latch portions are included in an upper part and a lower part of the pair of opposing board support frames and the another pair of opposing board support frames.

2. The control device according to claim 1, wherein the case includes pillars disposed in four corners and the pillars are connected by the pair of opposing board support frames and the another pair of opposing board support frames.

3. The control device according to claim 1, wherein the first board is engaged with the latch portions included in the upper part of the pair of opposing board support frames and the second board is engaged with the latch portions included in the lower part of the another pair of opposing board support frames.

4. The control device according to claim 1, wherein the pair of opposing board support frames includes the latch portions for fixing the first board in the upper part thereof and elastic holes.

5. The control device according to claim 1, wherein at least one guide notch portion for positioning the first board with respect to the case is formed in an outer peripheral surface of the first board.

6. The control device according to claim 1, wherein at least one radiator latch portion for positioning the radiator with respect to the case is formed in an outer peripheral surface of the radiator.

7. The control device according to claim 1, wherein the radiator includes a board including a cooling fan.

8. The control device according to claim 1 further comprising a protective cover, wherein at least one recess is formed in an outer peripheral surface of the protective cover and engaged with at least one of the latch portions of the case.

9. The control device according to claim 1, wherein at least one guide notch portion for positioning the second board with respect to the case is formed in an outer peripheral surface of the second board.

10. The control device according to claim 5, wherein at least one guide notch portion for positioning the second board with respect to the case is formed in an outer peripheral surface of the second board.

* * * * *